United States Patent [19]

Wang et al.

[11] Patent Number: 5,756,398
[45] Date of Patent: May 26, 1998

[54] COMPOSITION AND METHOD FOR POLISHING A COMPOSITE COMPRISING TITANIUM

[75] Inventors: Jiun-Fang Wang, Hockessin, Del.; Anantha R. Sethuraman, Avondale; Lee Melbourne Cook, Steelville, both of Pa.

[73] Assignee: Rodel, Inc., Newark, Del.

[21] Appl. No.: 819,236

[22] Filed: Mar. 17, 1997

[51] Int. Cl.$^6$ ........................................................ B24D 3/34
[52] U.S. Cl. .................. 438/692; 51/309; 106/3; 156/636.1; 156/645.1
[58] Field of Search ............ 51/309; 156/636.1, 156/645.1; 106/3; 438/692; 437/228, 241, 242

[56] References Cited

U.S. PATENT DOCUMENTS

| | | | |
|---|---|---|---|
| 4,954,142 | 9/1990 | Carr et al. | 51/309 |
| 4,959,113 | 9/1990 | Roberts | 156/636 |
| 5,244,534 | 9/1993 | Yu et al. | 438/692 |
| 5,382,272 | 1/1995 | Cook et al. | 51/293 |
| 5,391,258 | 2/1995 | Brancaleoni et al. | 156/636 |
| 5,476,606 | 12/1995 | Brancaleoni et al. | 252/79.1 |

OTHER PUBLICATIONS

"Pattern Density Effects in Tungsten CMP", Rutten et al., Proc. VMIC 1995, pp. 491–497, 1995.

*Primary Examiner*—Deborah Jones
*Attorney, Agent, or Firm*—Kenneth A. Benson

[57] ABSTRACT

An aqueous slurry is provided which is useful for the chemical-mechanical polishing of substrates containing titanium comprising: water, submicron abrasive particles, an oxidizing agent, and a combination of complexing agents comprising a phthalate compound and a compound which is a di- or tri-carboxylic acid with at least one hydroxyl group in an alpha position relative to one of the carboxyl groups.

17 Claims, No Drawings

COMPOSITION AND METHOD FOR POLISHING A COMPOSITE COMPRISING TITANIUM

BACKGROUND OF THE INVENTION

1. Field of the Invention

The present invention relates to compositions which are useful as slurries used during the chemical-mechanical polishing of substrates, especially those comprised of silica, titanium and titanium nitride.

2. Description of Related Art

Conventional polishing compositions or slurries generally consist of a solution which contains abrasive particles. The part, or substrate, is bathed or rinsed in the slurry while an elastomeric pad is pressed against the substrate and the pad and substrate are moved relative to each other. Thus the abrasive particles are pressed against the substrate under load and the lateral motion of the pad causes the abrasive particles to move across the substrate surface, resulting in wear and volumetric removal of the substrate surface.

In many cases the rate of surface removal is determined solely by the degree of applied pressure, the velocity of pad rotation and the chemical activity of the slurry particle. Enhancement of the chemical activity of the polishing particle has been the basis of numerous patents, for example U.S. Pat. No. 4959113 (Roberts) and U.S. Pat. No. 5382272 (Cook et al.) both assigned to Rodel, Inc., Newark, Del.

An alternative means of increasing polishing rates is to add components to the slurries which by themselves are corrosive to the substrate. When used together with abrasive particles, substantially higher polishing rates may be achieved. This process, often termed chemical-mechanical polishing (CMP) is a preferred technique for polishing of semiconductors and semiconductor devices, particularly integrated circuits. Often additives are introduced to the slurries which accelerate the dissolution of the metal component in the polishing of dielectric/metal composite structures such as interconnect vias in integrated circuit structures. The purpose of this and other related techniques is to preferentially remove the metal portion of the circuit so that the resulting surface becomes coplanar with an insulating or dielectric feature, typically composed of $SiO_2$. This process is termed planarization.

Often titanium/titanium nitride films are used to promote adhesion of tungsten to silicon oxide insulating layers. Rutten et al. ("Pattern Density Effects in Tungsten CMP", Jun. 27–29, 1995 VMIC Conference, ISMIC - 104/95/0491) discusses the problems encountered when planarizing a structure in which tungsten, titanium and titanium nitride are used. Ideally, the titanium/titanium nitride layer should be removed at a rate comparable to the rate for tungsten removal, however, titanium is a very non-corrosive material. It does not oxidize easily and, therefore, is difficult to remove.

U.S. Pat. Nos. 5,391,258 and 5,476,606 show slurry compositions useful for planarizing composites of silica and a metal such as tungsten. The slurry compositions of the present invention fall within the claims of these patents.

The objective of the present invention is to find slurry compositions which are particularly effective on a composite comprising titanium.

SUMMARY OF THE INVENTION

An aqueous slurry is provided which is useful for the chemical-mechanical polishing of substrates containing titanium comprising: water, submicron abrasive particles, an oxidizing agent, and a combination of complexing agents comprising a phthalate compound and a compound which is a di- or tri-carboxylic acid with at least one hydroxyl group in an alpha position relative to one of the carboxyl groups.

A method of chemical-mechanical polishing of substrates containing titanium with a polishing slurry comprising: water, submicron abrasive particles, an oxidizing agent, and a combination of complexing agents comprising a phthalate compound and a compound which is a di- or tri- carboxylic acid with at least one hydroxyl group in an alpha position relative to one of the carboxyl groups is also provided.

DESCRIPTION OF THE PREFERRED EMBODIMENTS

It has been found that the addition of compounds which complex with silica to polishing slurries used in the chemical-mechanical polishing of composites comprised of silica and titanium can provide a high rate of removal of titanium and other metals in the composites while the rate of removal of silica remains low.

Compounds which act as complexing agents or chelating agents for $SiO_2$ are described in great detail in U.S. Pat. No. 5391258 and U.S. Pat. No. 5476606. These compounds must have at least two acid groups present in the structure which can affect complexation to the silica. Acid species are defined as those functional groups having a dissociable proton. These include, but are not limited to, carboxylate, hydroxyl, sulfonic and phosphonic groups. Carboxylate and hydroxyl groups are preferred as these are present in the widest variety of effective species. Particularly effective are structures which possess two or more carboxylate groups with hydroxyl groups in an alpha position, such as straight chain mono- and di-carboxylic acids and salts including, for example, malic acid and malates, tartaric acid and tartarates and gluconic acid and gluconates. Also effective are tri- and polycarboxylic acids and salts with secondary or tertiary hydroxyl groups in an alpha position relative to a carboxylic group such as citric acid and citrates. Also effective are compounds containing a benzene ring such as ortho di- and polyhydroxybenzoic acids and acid salts, phthalic acid and acid salts, pyrocatecol, pyrogallol, gallic acid and gallates and tannic acid and tannates. Generally these complexing agents are used in slurries for CMP at about 2% to about 7% by weight.

In the examples to follow, a phthalate compound is used in combination with other complexing agents which are di- or tri- carboxylic acids with at least one hydroxyl group in an alpha position relative to one of the carboxyl groups to enhance the rate of removal of titanium. The phthalate compound may be added to the composition as a phthalate, such as potassium hydrogen phthalate, or it may be generated in the composition as shown in the examples by the addition of phthalic anhydride and ammonia to generate ammonium hydrogen phthalate.

The submicron abrasive particles in the compositions of the present invention may be comprised of any of the oxides used for chemical-mechanical polishing such as alumina, silica, ceria, and zirconia. Generally abrasive particles are used in slurries for CMP at about 1% to about 15% by weight. Alumina is a preferred abrasive particle. Most preferred is alumina at about 7% by weight.

The oxidizing agents in the compositions of the present invention may be comprised of nitrates, iodates, perchlorates, or sulphates. Generally oxidizing agents are used in slurries for CMP at about 2% to about 7% by weight.

An iodate is a preferred oxidizing agent. Most preferred is potassium iodate at about 3% by weight.

EXAMPLE 1

8 inch wafers were polished on a Westech 372U polishing machine (available from IPEC Planar) under the following conditions: pressure 7 psi, carrier 50 rpm, table 40 rpm, back pressure 3 psi using an IC1000-P/SubaTM IV pad (available from Rodel, Inc., Newark, Del.). A polishing slurry of the following composition (by weight) was used during the polishing of these wafers: 3.1% phthalic anhydride, 3.14% potassium iodate, 1.23% of a 29% ammonia solution, 6.86% submicron alumina and 85.67% deionized water. Three types of wafers were polished under the above conditions. They had on their surface the following layers: 400 Angstroms Ti, 2000 Angstroms Ti or 8000 Angstroms tungsten/ 400 Angstroms TiN/250 Angstroms Ti layered. Clear times (the time in seconds to remove the layer or series of layers) for the three wafers were, respectively, 45, 255, and 235 seconds. It is known that this slurry is about twice as effective (has one-half of the time to clear) as a standard slurry used in this field which contains ferric nitrate

EXAMPLE 2

Wafers of the same type as described in Example 1 were polished in the same polishing machine and at the same polishing conditions as in Example 1. The slurry was different than the one in Example 1 only in that 20% of the phthalic anhydride on a molar basis was replaced by malic acid. In other words, the complexing agent in the slurry comprised a 4 to 1 ratio of phthalate to malic acid on a molar basis. For this slurry the clear times were 35 sec for the 400 Angstrom Ti layer, 160 sec for the 2000 Angstrom Ti layer, and 205 sec for the W/TiN/Ti combined surface layer.

EXAMPLE 3

Wafers of the same type as described in Example 1 were polished in the same polishing machine and at the same polishing conditions as in Example 1. The slurry was different that the one in Example 1 only in that 20% of the phthalic anhydride on a molar basis was replaced by citric acid. For this slurry the clear times were 30 sec for the 400 Angstrom Ti layer, 140 sec for the 2000 Angstrom Ti layer, and 220 sec for the W/TiN/Ti combined surface layer.

It is obvious from these Examples that substitution of some of the phthalate in these formulations with a di- or tri-carboxylic acid with at least one hydroxyl group in an alpha position relative to one of the carboxyl groups gives reduced clear times. This synergistic effect was unknown until now. The mole ratio of (a) phthalate to (b) the compound which is a di- or tri-carboxylic acid with at least one hydroxyl group in an alpha position relative to one of the carboxyl groups may be about 1:1 to about 10:1. A preferred range of ratios of (a) to (b) is from about 2:1 to about 7:1. A most preferred ratio is about 4:1.

Nothing from the above discussion is meant to be restrictive in any way with respect to the present invention. All limitations to the scope of the present invention are found in the claims, as provided below.

We claim:

1. A composition, which is an aqueous slurry useful for the chemical-mechanical polishing of substrates which contain titanium, comprising: water, submicron abrasive particles, an oxidizing agent, and a combination of complexing agents comprising a phthalate compound and a compound which is a di- or tri-carboxylic acid with at least one hydroxyl group in an alpha position relative to one of the carboxyl groups.

2. A composition according to claim 1 wherein said submicron abrasive particles are alumina.

3. A composition according to claim 1 wherein said oxidizing agent is potassium iodate.

4. A composition according to claim 1 wherein said compound which is a di- or tri-carboxylic acid with at least one hydroxyl group in an alpha position relative to one of the carboxyl groups is malic acid.

5. A composition according to claim 1 wherein said compound which is a di- or tri-carboxylic acid with at least one hydroxyl group in an alpha position relative to one of the carboxyl groups is citric acid.

6. A composition according to claim 1 wherein said phthalate compound is ammonium hydrogen phthalate.

7. A composition according to claim 1 wherein said combination of complexing agents is comprised of (a) a phthalate compound and (b) a compound which is a di- or tri-carboxylic acid with at least one hydroxyl group in an alpha position relative to one of the carboxyl groups and the mole ratio of (a) to (b) is about 1:1 to about 10:1 and wherein the total amount of complexing agent is about 2% to about 7% by weight in said composition.

8. A composition according to claim 1 comprising on a weight basis about 1% to about 15% submicron abrasive particles, about 2% to about 7% oxidizing agent, and about 2% to about 7% of said complexing agents.

9. A composition according to claim 1 comprising on a weight basis about 7% alumina, about 3% potassium iodate, about 4% of complexing agents comprising (a) a phthalate compound and (b) a compound which is a di- or tri-carboxylic acid with at least one hydroxyl group in an alpha position relative to one of the carboxyl groups wherein the mole ratio of (a) to (b) is 4:1.

10. A method of polishing a substrate comprising titanium wherein said substrate is pressed against a polishing pad, said substrate and said pad are moved relative to each other, and a polishing composition is applied to said pad during the polishing operation, said polishing composition comprising: water, submicron abrasive particles, an oxidizing agent, and a combination of complexing agents comprising a phthalate compound and a compound which is a di- or tri-carboxylic acid with at least one hydroxyl group in an alpha position relative to one of the carboxyl groups.

11. A method according to claim 10 wherein said submicron abrasive particles are alumina.

12. A method according to claim 10 wherein said oxidizing agent is potassium iodate.

13. A method according to claim 10 wherein said compound which is a di- or tri-carboxylic acid with at least one hydroxyl group in an alpha position relative to one of the carboxyl groups is malic acid.

14. A method according to claim 10 wherein said compound which is a di- or tri-carboxylic acid with at least one hydroxyl group in an alpha position relative to one of the carboxyl groups is citric acid.

15. A method according to claim 10 wherein said phthalate compound is ammonium hydrogen phthalate.

16. A method according to claim 10 wherein said combination of complexing agents is comprised of (a) a phthalate compound and (b) a compound which is a di- or tri-carboxylic acid with at least one hydroxyl group in an alpha position relative to one of the carboxyl groups and the mole ratio of (a) to (b) is about 1:1 to about 10:1 and wherein the total amount of complexing agent is about 2% to about 7% by weight in said composition.

17. A method according to claim 10 wherein said polishing composition comprises on a weight basis about 7% alumina, about 3% potassium iodate, about 4% of complexing agents comprising (a) a phthalate compound and (b) a compound which is a di- or tri-carboxylic acid with at least one hydroxyl group in an alpha position relative to one of the carboxyl groups wherein the mole ratio of (a) to (b) is 4:1.

* * * * *